(12) United States Patent
Lam

(10) Patent No.: US 11,083,113 B1
(45) Date of Patent: Aug. 3, 2021

(54) FLEXIBLE RACK-MOUNTED CABINET-MOUNTED CABINET COVERING STRUCTURE FOR INCREASING AIRFLOW WHILE ALLOWING PLACEMENT OF NON STANDARD SIZE EQUIPMENT

(71) Applicant: Lok Yu Lam, Hong Kong (HK)

(72) Inventor: Lok Yu Lam, Hong Kong (HK)

( * ) Notice: Subject to any disclaimer, the term of this patent is extended or adjusted under 35 U.S.C. 154(b) by 0 days.

(21) Appl. No.: 16/830,765

(22) Filed: Mar. 26, 2020

(51) Int. Cl.
H05K 7/20 (2006.01)
H05K 5/03 (2006.01)

(52) U.S. Cl.
CPC .......... *H05K 7/20836* (2013.01); *H05K 5/03* (2013.01)

(58) Field of Classification Search
CPC ........ H05K 7/186; H05K 5/0213; H05K 5/03; H05K 7/20836; H05K 5/0217
See application file for complete search history.

(56) References Cited

U.S. PATENT DOCUMENTS

| | | | | |
|---|---|---|---|---|
| 2,168,022 A * | 8/1939 | Drager | ............... | E06B 9/115 160/231.2 |
| 4,279,454 A * | 7/1981 | Koiso | ............... | E06B 9/115 160/196.1 |
| 4,795,206 A * | 1/1989 | Adams | ............... | B60J 5/14 160/201 |
| 7,476,804 B2 * | 1/2009 | Adducci | ............... | H02B 1/202 174/50 |
| 8,936,329 B2 * | 1/2015 | Kuo | ............... | A47B 96/00 312/297 |
| 9,072,200 B2 * | 6/2015 | Dersch | ............... | H05K 7/20745 |
| 9,089,963 B2 * | 7/2015 | Freimuth | ............... | A47B 81/00 |
| 9,258,911 B2 * | 2/2016 | Cox | ............... | H05K 7/1488 |
| 10,368,466 B1 * | 7/2019 | Frink | ............... | H05K 7/20145 |
| 2004/0217072 A1 * | 11/2004 | Bash | ............... | H05K 7/20736 211/26 |
| 2007/0210679 A1 * | 9/2007 | Adducci | ............... | H05K 7/186 312/7.2 |
| 2007/0293138 A1 * | 12/2007 | Adducci | ............... | H04Q 1/064 454/184 |
| 2011/0108207 A1 * | 5/2011 | Mainers | ............... | H05K 7/20709 160/87 |
| 2013/0065501 A1 * | 3/2013 | Wang | ............... | H05K 7/20181 454/184 |
| 2015/0373875 A1 * | 12/2015 | Kira | ............... | H05K 7/20181 96/407 |
| 2016/0007506 A1 * | 1/2016 | Karasawa | ............... | H05K 7/20736 361/679.48 |

* cited by examiner

*Primary Examiner* — Adam B Dravininkas

(57) ABSTRACT

A rack-mounted cabinet covering structure including a first side covering and a second side covering. The first side covering may include a first tightener and a first rollable rectangular layer. The first tightener may be coupled to the first rollable rectangular layer at or near a first lateral edge. The first tightener may include a first tightener height that is less than a first sheet height between the first top edge and the first bottom edge. The second covering may include a second tightener and a second rollable rectangular layer configured to couple with the first rollable rectangular layer. The second tightener may be coupled to the second rollable rectangular layer at or near a second lateral edge. The second tightener may include a second tightener height that is less than a second sheet height between the second top edge and the second bottom edge.

10 Claims, 4 Drawing Sheets

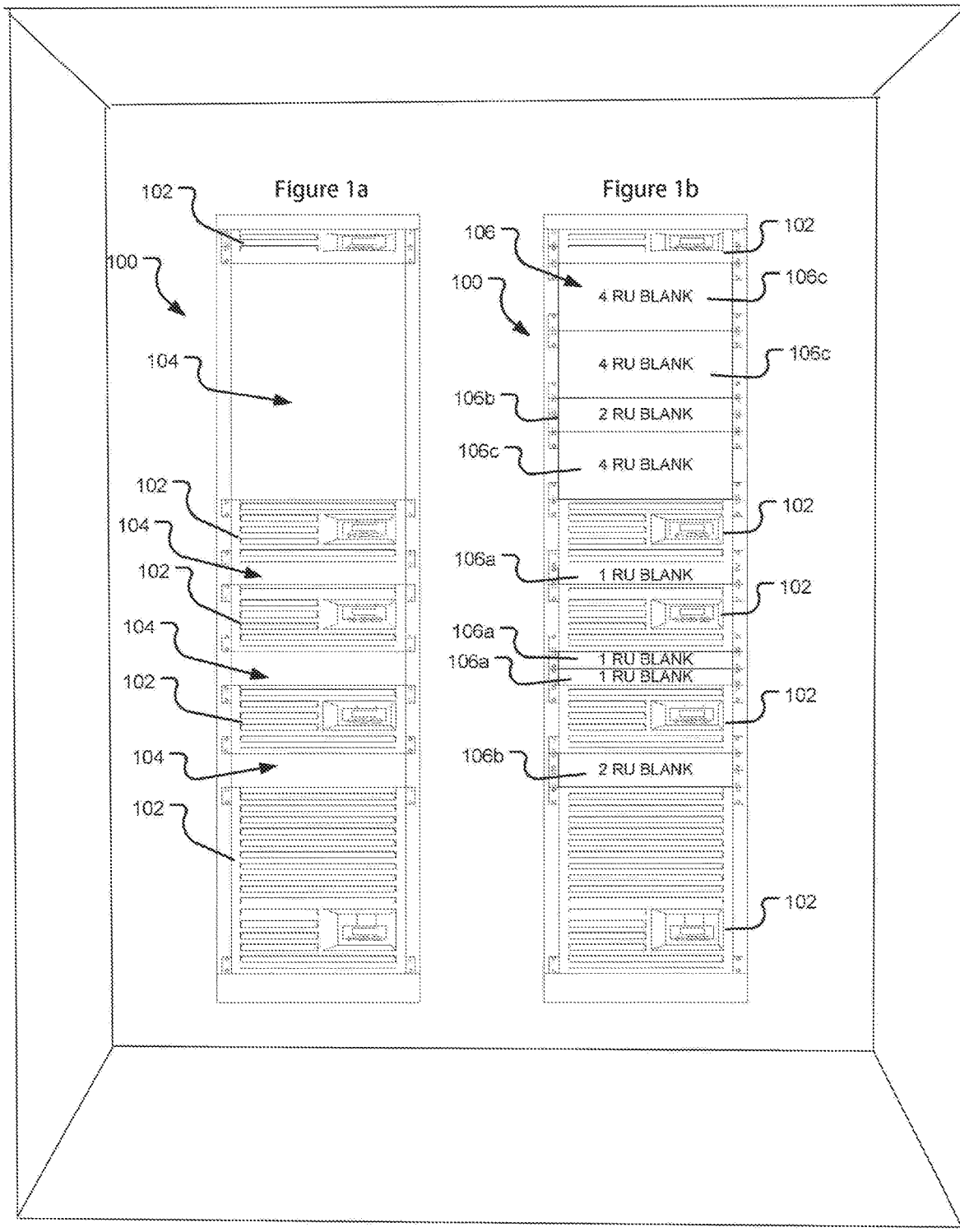

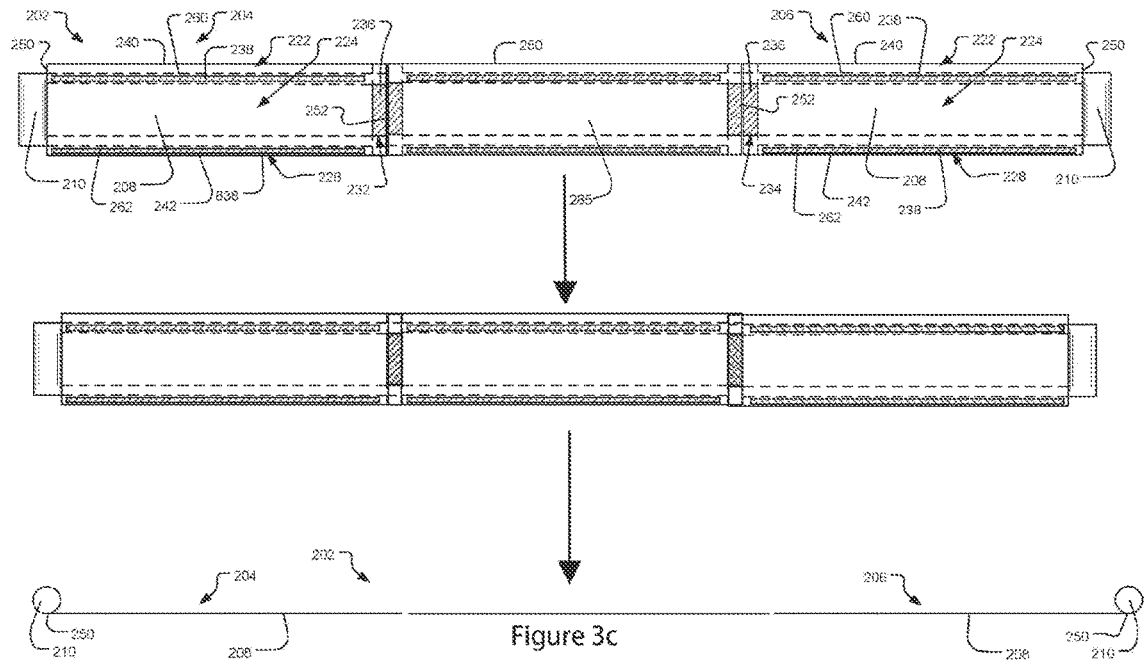
Figure 3a
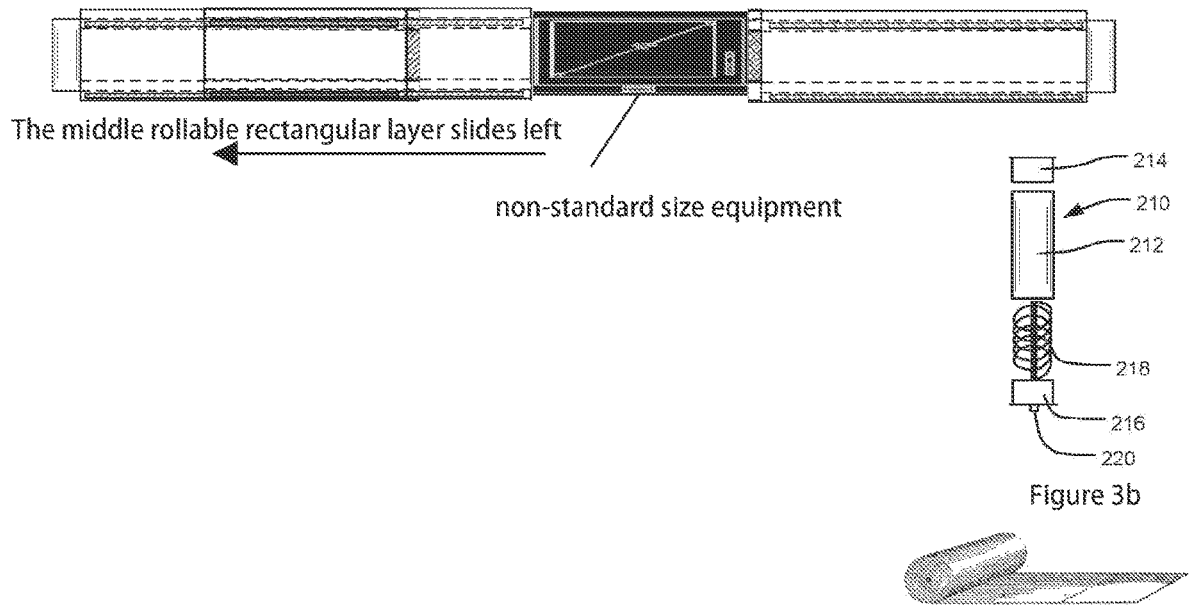
Figure 3c
The middle rollable rectangular layer slides left
non-standard size equipment
Figure 3b

FLEXIBLE RACK-MOUNTED CABINET-MOUNTED CABINET COVERING STRUCTURE FOR INCREASING AIRFLOW WHILE ALLOWING PLACEMENT OF NON STANDARD SIZE EQUIPMENT

FIELD OF THE INVENTION

The present invention relates generally to rack-mounted cabinet. Specifically, this invention relates to using flexible covering structures to facilitate air flow within the rack in order to flexibly adjust space changes caused by the movement of the racks that cause generating the most heat.

BACKGROUND OF THE DISCLOSED TECHNOLOGY

Data centers and gateway facilities consume massive amounts of energy, not only from the various computer, telecommunications, and storage systems in the facilities, but also from the respective cooling systems needed to manage the heat generated by the equipment. With continuing expansion of computing networks, rising energy costs, and a desire to operate sustainable facilities, the need to efficiently manage energy consumption in data centers and gateway facilities becomes increasingly important. While facility operators may have somewhat limited control over the energy consumed by each piece of equipment in the data center or gateway facility, operators can control the flow of hot and cold air around the equipment.

A data center is a computing hub that contains servers and storage equipment that run application software that processes and stores content and data. A gateway facility, on the other hand, is a telecommunications hub, or node, that processes and routes various forms of communication (e.g., phone calls, web browsing, streaming video) through a vast network of interconnected nodes, networks, and users. While data centers and gateway facilities may perform different functions, both facilities use similar, and often the same, equipment (e.g., servers, routers, switches, server appliances, storage libraries) and face the same thermal management challenges.

In order to keep the equipment running optimally, the layout of data centers and gateway facilities are designed in conjunction with the heating, ventilation, and air-conditioning systems or, more particular to this type of environment, the computer room air-conditioning system. Because most server and gateway type equipment are mounted on standardized rack-mounted cabinet s, and the equipment is designed to intake cool air in the front of the unit and exhaust hot air in the back of the unit, the system is designed to flow cool air to the front of the equipment rack-mounted cabinet s and to pull hot air from back of the rack-mounted cabinet s for recirculation into the system.

Thermal management becomes challenging when airflow is permitted to freely flow from the hot side or back of the units in the rack-mounted cabinet to the cool side or front of the units in the rack-mounted cabinet, Because equipment in the rack-mounted cabinet s require maintenance, replacement, and/or reconfiguration, there are times when the rack-mounted cabinet s are only partially filled, leaving gaps for air to flow from the back of the rack-mounted cabinet s to the front. Additionally, rack-mounted cabinet s may be only partially filled when scaling an operation up or down.

A data center is a facility that centralizes an organization's IT operations and equipment, as well as where it stores, manages, and disseminates its data. Data centers house a network's most critical systems and are vital to the continuity of daily operations, Consequentially, the security and reliability of data centers and their information is a top priority for organizations.

Data center designs can generally be classified as Internet-facing or enterprise (or "internal") data centers. Internet-facing data centers usually support relatively few applications, are typically browser-based, and have many users, typically unknown. In contrast, enterprise data centers service fewer users, but host more applications that vary from off-the-shelf to custom applications.

A data center rack is primarily designed to house servers in different form factors (such as attached or blade servers). Although they are mainly designed to hold servers, some are designed to hold other components, such as Networking, equipment, telecommunication equipment, and cooling systems. Each rack is generally prefabricated with apertures for connecting electrical, networking and Internet cables. Data center racks are created using a systematic design and are classified based on their capacity or the number of bays—essentially, the amount of equipment they can hold. Data centers and gateway facilities consume massive amounts of energy, not only from the various computer, telecommunications, and storage systems in the facilities, but also from the respective cooling systems needed to manage the heat generated by the equipment. With continuing expansion of computing networks, rising energy costs, and a desire to operate sustainable facilities, the need to efficiently manage energy consumption in data centers and gateway facilities becomes increasingly important. While facility operators may have somewhat limited control over the energy consumed by each piece of equipment in the data center or gateway facility, operators must control adequately the flow of hot and cold air around the equipment.

A key objective of this invention is to ensure the flow of air in and out of a data center rack. As one can imagine data centers can get very hot, very quickly, unless large scale cooling systems are built into the structure. Fans can blow warm air away from delicate internal components but that simply pushes the heat elsewhere. Unless the entire room is air-conditioned and cooled moving the air around will do very little to protect the processors. In a best case scenario, they will simply shutdown and refuse to switch on again until the temperature has fallen. In a worst case, thousands of pounds' worth of computer equipment—and possibly even more disastrously—the data stored on them—could become broken, corrupted and fit only for scrap.

One challenge of data center rack is the movement rack attached computers. The computers inside a data center rack do not stay within the rack forever. Due to business needs, it is common for the computers to move in and out of a rack. Because of the ongoing need to change, it causes changes in air flow patterns within a data center rack, which is what this invention is trying to resolve.

SUMMARY OF THE INVENTION

Aspects of the present disclosure may involve a rack-mounted cabinet covering structure including a first side covering and a second side covering. The first side covering may include a first tightener and a first rollable rectangular layer including a first lateral edge, a first medial edge opposite the first lateral edge, a first top edge, and a first bottom edge opposite the first top edge and adjacent the first lateral edge and the first medial edge. The first medial edge may include a first fastener, the first tightener coupled to the first rollable rectangular layer at or near the first lateral edge, the first tightener including a first tightener height that is less than a first sheet height between the first top edge and the first bottom edge. The second side covering may include a second tightener and a second rollable rectangular layer including a second lateral edge, a second medial edge opposite the second lateral edge, a second top edge, and a second bottom edge opposite the second top edge and adjacent the second lateral edge and the second medial edge. The second medial edge may include a second fastener configured to couple with the first fastener, the second tightener coupled to the second rollable rectangular layer at or near the second lateral edge, the second tightener including a second tightener height that is less than a second sheet height between the second top edge and the second bottom edge. The first side covering and the second side covering may be configured to be used in conjunction with one another to covering a slot in a rack-mounted cabinet.

In some instances, a middle covering (280) comprises a middle rectangular sheet comprising a left side of the middle covering coupleable to the first medial side (252) via a middle left-sided fastener. The middle covering (280) also includes a right side of the middle covering coupleable to the second medial side (252) via a middle right-sided fastener. The middle covering (280) further includes a middle top side, a middle bottom side, and a middle rollable rectangular layer (285) coupled between the left side, right side, top side, and bottom side, wherein the middle rollable rectangular layer (285), the first side covering and the second side covering are configured to be used in conjunction with one another to covering a slot in a rack-mounted cabinet.

In certain instances, the first top edge is foldable along a first top fold line extending a first length of the first rollable rectangular layer, the first bottom edge is foldable along a first bottom fold line extending the first length, a first distance between the first top fold line and the first bottom fold line being substantially equal to the first tightener height, and wherein the second top edge is foldable along a second top fold line extending a second length of the second rollable rectangular layer, the second bottom edge is foldable along a second bottom fold line extending the second length, a second distance between the second top fold line and the second bottom fold line being substantially equal to the second tightener height.

In certain instances, the first rollable rectangular layer may further include a first top fastener and a first bottom fastener, the first top fastener positioned above the first top fold line, the first bottom fastener positioned above the first bottom fold line, and wherein the second rollable rectangular layer may further include a second top fastener and a second bottom fastener, the second top fastener positioned above the second top fold line, the second bottom fastener positioned above the second bottom fold line.

In certain instances, the first rollable rectangular layer may further include a first top fastener and a first bottom fastener, the first top fastener positioned below the first top fold line, the first bottom fastener positioned below the first bottom fold line, and wherein the second rollable rectangular layer may further include a second top fastener and a second bottom fastener, the second top fastener positioned below the second top fold line, the second bottom fastener positioned below the second bottom fold line.

In certain instances, the first tightener may be configured to be coupled to a first vertical mounting post of the rack-mounted cabinet, and the second tightener may be configured to be coupled to a second vertical mounting post of the rack-mounted cabinet that is opposite the first vertical mounting post, the first rollable rectangular layer may be configured to unfurl from first tightener and the second rollable rectangular layer may be configured to unfurl from the second tightener such that the first and second fasteners are fastened together at about a midpoint between the first and second vertical mounting posts of the rack-mounted cabinet.

In certain instances, when the first and second fasteners are fastened together, the first and second side coverings may combine to covering a slot in the rack-mounted cabinet.

In certain instances, the first tightener may include a first spool, the second tightener may include a second spool, and wherein, in a furled state, the first rollable rectangular layer is configured to furl on the first spool of the first tightener, and the second rollable rectangular layer is configured to furl on a second spool of the second tightener, the first and second rollable rectangular layers do not covering the slot in the rack-mounted cabinet in the furled state.

In certain instances, the first tightener height may be equal to the second tightener height, and the first sheet height may be equal to the second sheet height.

In certain instances, the first fastener and the second fastener may include a complementary hook and loop closure system.

In certain instances, the rack-mounted cabinet covering structure may further include at least one of a tightener rack-mounted cabinet et or a shaft for coupling the first and second side coverings to a rack-mounted cabinet.

Aspects of the present disclosure may involve a kit including at least one rack-mounted cabinet covering structure, and may further include packaging materials to package the at least one of the rack-mounted cabinet covering structure.

In certain instances, the kit may further include at least one tightener rack-mounted cabinet for coupling the rack-mounted cabinet covering structure to a rack-mounted cabinet.

In certain instances, the kit may further include at least one shaft for vertically orienting the at least one of the rack-mounted cabinet covering structure relative to a rack-mounted cabinet.

Aspects of the present disclosure may involve a system for blocking slots in a rack-mounted cabinet including an upper covering structure 291 and a lower covering structure 292. The upper covering structure for covering an upper slot in the rack-mounted cabinet and including a first upper side covering and a second upper side covering. The first upper side covering coupling to a first portion of the rack-mounted cabinet. The second upper side covering coupling to a second portion of the rack-mounted cabinet. The first upper side covering including a first upper side rollable rectangular layer configured to extend and retract from the first portion of the rack-mounted cabinet. The second upper side covering including a second upper side rollable rectangular layer configured to extend and retract from the second portion of the rack-mounted cabinet. The first upper side rollable rectangular layer and the second upper side rollable rectangular layer configured to couple to each other when in a first extended state so as to covering the upper slot. The lower covering structure for covering a lower slot in the rack-mounted cabinet. The lower slot being immediately below the upper slot. The lower covering structure including a first lower side covering and a second lower side covering. The first lower side covering coupling to the first portion of the rack-mounted cabinet. The second lower side covering coupling to the second portion of the rack-mounted cabinet. The first lower side covering including a first lower side rollable rectangular layer configured to extend and retract from the first portion of the rack-mounted cabinet. The second lower side covering including a second lower side rollable rectangular layer configured to extend and retract from the second portion of the rack-mounted cabinet. The first lower side rollable rectangular layer and the second lower side rollable rectangular layer configured to couple to each other when in a second extended state so as to covering the lower slot.

In certain instances, a top edge of the lower covering structure overlays or underlays a bottom edge of the upper covering structure.

In certain instances, the first upper side covering further includes a first upper tightener for exerting a retraction force on the first upper side rollable rectangular layer, the second upper side covering further includes a second upper tightener for exerting a retraction force on the second upper side rollable rectangular layer, the first lower side covering further includes a first lower tightener for exerting a retraction force on the first lower side rollable rectangular layer, and the second lower side covering further includes a second lower tightener for exerting a retraction force on the second lower side rollable rectangular layer. In certain instances, the system may further include a first side shaft affixed relative to the first portion of the rack-mounted cabinet and a second side shaft affixed relative to the second portion of the rack-mounted cabinet, the first upper tightener and the first lower tightener being vertically arranged or stacked on the first side shaft, the second upper tightener and the second lower tightener being vertically arranged or stacked on the second side shaft.

BRIEF DESCRIPTION OF THE DRAWINGS

FIG. 1A (prior art) is a front view of a rack-mounted cabinet housing five pieces of equipment;

FIG. 1B (prior art) is a front view of a rack-mounted cabinet housing five pieces of equipment with blanks positioned within the vacant slots between the pieces of equipment;

FIG. 3A is a front view of a covering structure including a first side covering structure and a second side covering structure;

FIG. 3B is a front exploded view of a tightener;

FIG. 3C is a top view of the first side covering structure and the second side covering structure.

DETAILED DESCRIPTION OF EMBODIMENTS OF THE DISCLOSED TECHNOLOGY

References will now be made in detail to the present exemplary embodiments, examples of which are illustrated in the accompanying drawings. Certain examples are shown in the above-identified figures and described in detail below. In describing these examples, like or identical reference numbers are used to identify common or similar elements. The figures are not necessarily to scale and certain features and certain views of the figures may be shown exaggerated in scale or in schematic for clarity and/or conciseness.

Figures 2A, 2B:
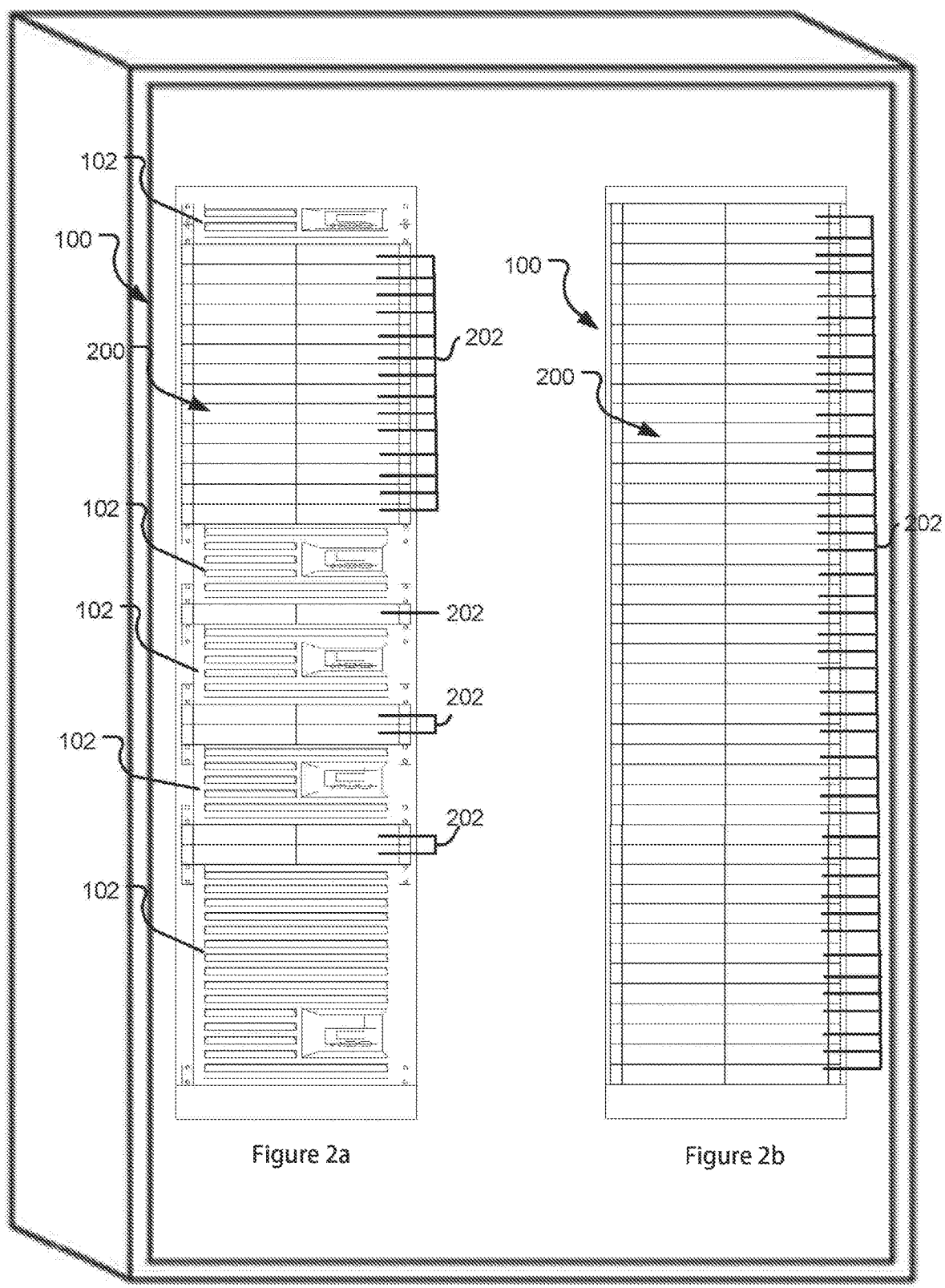
FIG. 2A is a front view of a rack-mounted cabinet housing five pieces of equipment with covering assemblies covering the vacant slots between the pieces of equipment.
FIG. 2B is a front view of an empty rack-mounted cabinet with covering assemblies covering all slots in the rack-mounted cabinet.

Aspects of the present disclosure involve a rack-mounted cabinet covering apparatus and system for blocking airflow from flowing through open slots in a rack-mounted cabinet and causing cool and hot air to comingle, which ultimately cause hotter air to flow into the intake of the equipment housed within the rack-mounted cabinet. As seen in FIG. 2A, which is a front view of a 44 RU rack-mounted cabinet 100 housing five pieces of equipment 102, the rack-mounted cabinet covering system 200 includes multiple covering assemblies 202 that are 1 RU in height. Each covering structure 202 is positioned laterally adjacent a slot in the rack-mounted cabinet and may be deployed to covering an open slot or retracted so as to not covering the slot. Accordingly, individual covering assemblies 202 may be employed during swapping or reconfiguring of the equipment 102 within the rack-mounted cabinet 100 on an as-needed basis. For example, if a 2 RU piece of equipment 102 is removed from the rack-mounted cabinet 100, two covering assemblies 202 may be employed to covering the vacant space or slot that was previously occupied by the 2 RU piece of equipment. Since the covering assemblies 202 are 1 RU in height, as few as 1 RU may be covered with the covering structure 202, or, for example and as seen in FIG. 2B, all slots in the rack-mounted cabinet 100 (e.g., 44 RU) may be fully covered with covering assemblies 202. Accordingly, any number of covering assemblies 202 may be employed to fit the given needs of a particular rack-mounted cabinet 100 of equipment 102.

Reference is made to FIG. 3A, which depicts a front view of a single covering structure 202. As seen in the figure, the covering structure 202 includes a left or first side covering structure 204 and a right or second side covering structure 206, which is a mirror image design of the first side covering structure 204. The first and second side covering assemblies 204, 206 are each fitted, respectively, to right and left vertical mounting posts of a rack-mounted cabinet. When a slot is vacant or open (i.e., no equipment within the slot), the right and left side covering assemblies 204, 206 may be operably couple together at generally a midpoint between right and left vertical mounting posts of the rack-mounted cabinet to close off or block the formerly open slot. The first and second side covering assemblies 204, 206 include substantially the same components; therefore, they will be discussed together.

The first and second side covering assemblies 204, 206 include a flexible, rectangular sheet 208 and a tightener 210. The tightener 210 is coupled to a lateral edge 250 of the rectangular sheet 208. A medial edge 252 of the rectangular sheet 208 is opposite the lateral edge 250. The rectangular sheet 208 also includes a top edge 240 and a bottom edge 242.

Figure 4:
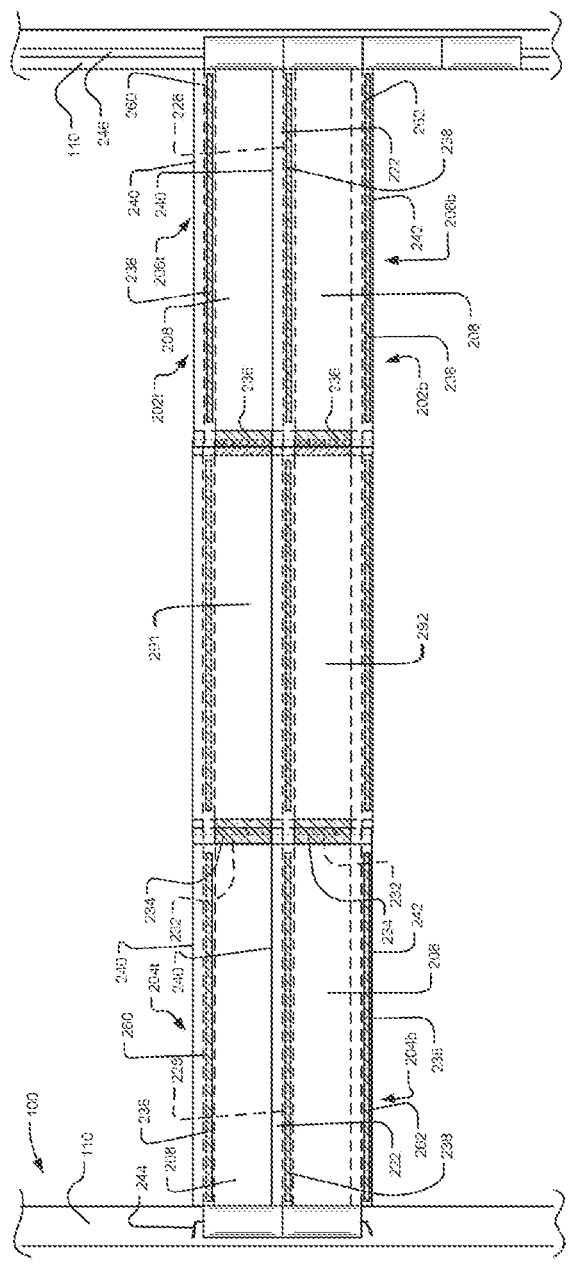
FIG. 4 is a front view of two covering assemblies attached to the vertical mounting posts of a rack-mounted cabinet.

The tightener 210 is coupled to the rack-mounted cabinet 100 at, for example, the vertical mounting post 110, as seen in FIG. 4, which is also the part of the rack-mounted cabinet 100 that the equipment couples with via a rack-mounted cabinet mount rail. Returning to FIG. 3B, which is a front exploded view of the tightener 210, the tightener 210 may function similar to a roller spring shade and may include a cylindrical housing or spool 212 with a passageway extending longitudinally therethrough, an end or idler plug 214 that fits within the passageway, a spring end plug 216 opposite the end plug 214, and a spring 218 coupled with the spring end plug 216. The spring 218 and the spring end plug 216 may be fitted within the passageway of the spool 212 on a side opposite the end plug 214. The spring 218 may be a torsion spring and may be wound relative to the spring end plug 216 via a shaft 220 to provide a winding or rotational force that tensions the rectangular sheet 208 when it is extended or rolled out. In this way, the rectangular sheet 208, which is flexible, may be coiled on the spool 212 when not needed (i.e., when a piece of equipment is positioned within a slot of the rack-mounted cabinet), and the rectangular sheet 208 may be pulled outward from the spool 212 towards the middle of the rack-mounted cabinet 100 (i.e., between the vertical mounting posts 110). And when the rectangular sheet 208 is pulled outward from the spool 212, the tightener 210 will exert a force towards the spool 212, thus keeping the rectangular sheet 208 in tension.

Referring to FIG. 3C, which is a top view of the first and second covering assemblies 204, 206 of the covering structure 202, the tighteners 210 couple to the lateral edges 250 of the rectangular sheet 208, which is shown in an unfurled or extended state.

Referring back to FIG. 3A, the rectangular sheet 208 includes, from top to bottom, a top overlay section 222, a central section 224, and an bottom underlay section 228. The first side covering structure 204 includes an underlay coupling section 232 at its medial edge 252, and the second side covering structure 206 includes an overlay section 234 at its medial edge at the positions where the first and second covering assemblies 204, 206 come together. Within the underlay and overlay coupling sections 232, 234 there is a fastener 236 depicted by the cross-hatched section. The first and second side covering assemblies 204, 206 may be coupled together via the fasteners 236 on the underlay and overlay coupling sections 232, 234.

To aid in the sealing of vertically adjacent covering assemblies 202 arranged above or below each other, the top overlay section 222 and the bottom underlay section 228 may also include fasteners 238 to aid in the prevention of air flowing through adjacent covering assemblies 202. As seen in FIG. 3A, the fastener 238 on the top overlay section 222 is spaced apart from the top edge 240, and the fastener 238 on the bottom underlay section 228 is immediately adjacent the bottom edge 242. In this way, when two covering assemblies 202 are positioned vertically adjacent to each other, the top overlay sections 222 of a lower covering structure 202 will overlay the bottom underlay sections 228 of the top covering structure 202 such that the fasteners 238 of each covering structure 202 align with each other.

To facilitate the rectangular sheet 208 being coiled on the spool 212, the top and bottom edges 240, 242 may be folded inward (i.e., towards the central section 224, respectively) about fold lines or seams 260, 262, as seen in FIG. 3A, that are generally in-line with the top and bottom ends of the spool 212, and then the folded rectangular sheet 208 may be coiled, wound, rolled, reeled, furled, or spooled onto the spool 212. In such a furled, rolled, coiled, wound, or reeled state, the rectangular sheets 208 do not covering or block the adjacent slot in the rack-mounted cabinet 100.

As seen in FIG. 3A, the fold lines 260, 262 generally bisect or divide the overlay and underlay sections 222, 228, respectively. Stated differently, the rectangular sheet 208 may be folded at the top and bottom edges 240, 242 so a height of the rectangular sheet 208 is about the same or substantially the same (e.g., within 0.125 inch) as a height of the spool 212 of the tightener 210. In this way, multiple covering assemblies 202 may be stacked or positioned above and below each other with the spools 212 generally coaxially aligned. The folded and furled rectangular sheet 208 (i.e., rectangular sheet 208 with the top and bottom edges 240, 242 folded inward) may be un-furled from the spool 212, and then the top and bottom edges 240, 242 may be unfolded so as to overlay or underlay with the edges 240, 242 of vertically adjacent covering assemblies 202.

Reference is made to FIG. 4, which depicts multiple covering assemblies 202t, 202b (top and bottom) used together to covering or block vertically adjacent slots in a rack-mounted cabinet. As seen in the figure, the bottom underlay sections 228 of the rectangular sheets 208 of the first and second side covering assemblies 204t, 206t at the top are positioned underneath or behind the top overlay sections 222 of the rectangular sheets 208 of the first and second covering assemblies 204b, 206b at the bottom such that the fasteners 238 overlap, Additionally, each of the underlay coupling sections 232 of the first side covering assemblies 204t, 204b are positioned underneath or behind the overlay coupling sections 234, respectively, of the second side covering assemblies 206t, 206b such that the fasteners 236 overlap. In this way, the rectangular sheets 208 of the first side covering assemblies 204t, 204b couple with the second side covering assemblies 206t, 206b at about a midpoint between the vertical mounting posts 110 of the rack-mounted cabinet 100.

The first and second covering assemblies 204t, 204b, 206t, 206b may couple together via interaction of the fasteners 236, which may be any type of hook and loop fastener such as, for example, magnets, or other mechanical device for fastening two objects or surfaces together. It is noted that the fasteners 236 of the underlay and overlay coupling sections 232, 234 are positioned centrally so as to not extend to the top and bottom edges 240, 242 of the rectangular sheet 208 for ease of coupling and decoupling the fasteners 236. The fasteners 236 may, however, extend to the top and bottom edges 240, 242 of the rectangular sheet 208. It is also noted that while the fasteners 238 are shown on only a portion of the overlay and underlay sections 222, 228, the fasteners 238 may be positioned on the entire overlay and underlay sections 222, 228. Additionally or alternatively, the fasteners 238 may be positioned on other portions of the overlay and underlay sections 222, 228 than are depicted in the figures. Positioning the fasteners 238 on only one side of the overlay and underlay sections 222, 228, as shown in the figures, may provide less bulk when folding the top and bottom edges 240, 242, and coiling the rectangular sheet 208 on the spool 212.

Each covering structure 202t, 202b may covering 1 RU of space in a rack-mounted cabinet 100 while also extending up and down to portions of adjacent slots or openings in the rack-mounted cabinet 100 via the extension of the top and bottom edges 240, 242. That is, adjacent covering assemblies 202t, 202b, as seen in FIG. 4, do not merely meet edge-to-edge, but, instead, overlap portions of each other to provide a seal between the adjacent covering assemblies 202. While the covering assemblies 202 are described as being 1 RU in height, the covering assemblies 202 may be designed to be 2 RU, 3 RU, 4 RU, 5 RU, 6 RU, 7 RU, 8 RU, 9 RU, or 10 RU in height, among others.

In certain instances, as seen on the left side of FIG. 4, the covering assemblies 202 may be coupled to the vertical mounting posts of a rack-mounted cabinet 100 via a rack-mounted cabinet et 244 that couples to the vertical mounting posts 110 of the rack-mounted cabinet 100. In this way, individual covering assemblies 202 may be attached and/or detached to the rack-mounted cabinet 100 on an as-needed basis via the rack-mounted cabinet et 244. That is, for example, when an operator removes a 2 RU piece of equipment 102 (not shown in FIG. 4) from the rack-mounted cabinet 100, the operator may install two vertically adjacent covering assemblies 202 in the vacant space where the 2 RU piece of equipment 102 was previously mounted.

In certain instances, as seen on the right side of FIG. 4, the covering assemblies 202 may be coupled to an external structure such as, for example, a vertical shaft 246 that is generally parallel with the vertical mounting posts 110 of the rack-mounted cabinet 100. The vertical shaft 246 may be coupled to the rack-mounted cabinet 100 at, for example, the vertical mounting posts 110. In such an instance, multiple covering assemblies 202 may be stacked on the vertical shaft 246. In FIG. 4, four second side covering assemblies 206 are shown for reference, but any number could be shown including forty-four to match a rack-mounted cabinet 100 of 44 RU.

In certain instances, one or more covering structure 202 including the first and second side covering assemblies 204, 206 may be combined into a kit. In certain instances, the kit may include one or more rack-mounted cabinet ets 244 and/or one or more vertical shafts 246 for coupling the tightener and rectangular sheet 208 to the rack-mounted cabinet 100.

In certain instances, and as discussed in reference to FIG. 2A, FIG. 2A, a rack-mounted cabinet covering system 200 may include multiple covering assemblies 202 that are 1 RU in height. The multiple covering assemblies may be referred to as a first covering structure for covering a first slot in a rack-mounted cabinet and a second covering structure for covering a second slot in the rack-mounted cabinet. The second slot may be positioned below the first slot. The first covering structure may include a first left side covering and a first right side covering. Similarly; the second covering structure may include a second left side covering and a second right side covering. The first and second left side coverings may couple to a left portion or side of the rack-mounted cabinet (as seen in FIG. 4), while the first and second right side coverings may couple to a right portion or side of the rack-mounted cabinet (also seen in FIG. 4). Each of the coverings may include a rectangular sheet 208 that may extend and retract from the right and left portions of the rack-mounted cabinet via an associated tightener having a spool. When the rectangular sheets 208 are in an extended state, the right and left coverings may couple to each other via fasteners at their medial edges. In the extended state, the slots are covered. In an opposite or furled state, the rectangular sheets 208 are retracted and furled on the spool. In the furled state, the slots are open or not covered.

In this arrangement with a first and a second covering structure in a vertically arranged manner, a top edge of the second covering structure may overlay or underlay a bottom edge of the first covering structure.

As discussed herein, the tighteners on the left portion of the rack-mounted cabinet may couple with a vertically oriented shaft that is affixed relative to a left side vertical mounting post of the rack-mounted cabinet, and the tighteners on the right portion of the rack-mounted cabinet may couple with a vertically oriented shaft that is affixed relative to a right side vertical mounting post of the rack-mounted cabinet. The tighteners may be stacked on each other on the shafts. And since the height of the tighteners are the same as the slot height (e.g., 1 RU), vertically stacking the tighteners should align the tightener with each of the slots in the rack-mounted cabinet.

What is claimed:

1. A flexible attached rack covering structure for increasing heatflow, comprising:
   a first side covering comprising:
   a first tightener and a first rollable rectangular layer comprising a first lateral side,
   a first medial side opposite the first lateral side,
   a first top side, and
   a first bottom side opposite the first top side and adjacent the first lateral side and the first medial side, the first medial side comprising a first fastener, the first tightener coupled to the first rollable rectangular layer at or near the first lateral side, the first tightener comprising a first tightener height that is less than a first sheet height between the first top side and the first bottom side; and
   a second side covering comprising a second tightener and a second rollable rectangular layer comprising:
   a second lateral side,
   a second medial side opposite the second lateral side,
   a second top side, and
   a second bottom side opposite the second top side and adjacent the second lateral side and the second medial side, the second medial side comprising a second fastener configured to couple with the first fastener, the second tightener coupled to the second rollable rectangular layer at or near the second lateral side, the second tightener comprising a second tightener height that is less than a second sheet height between the second top side and the second bottom side; and
   a middle covering comprising a middle rectangular sheet comprising:
   a left side of the middle covering coupleable to the first medial side via a middle left-sided fastener;
   a right side of the middle covering coupleable to the second medial side via a middle right-sided fastener;
   a middle top side;
   a middle bottom side;
   a middle rollable rectangular layer coupled between the left side, right side, top side, and bottom side, wherein the middle rollable rectangular layer, the first side covering and the second side covering are configured to be used in conjunction with one another to covering an opening in a attached rack.

2. The attached rack covering structure of claim 1, wherein the first top side is foldable along a first top fold line extending a first length of the first rollable rectangular layer, the first bottom side is foldable along a first bottom fold line extending the first length, a first distance between the first top fold line and the first bottom fold line being substantially equal to the first tightener height, and
   wherein the second top side is foldable along a second top fold line extending a second length of the second rollable rectangular layer, the second bottom side is foldable along a second bottom fold line extending the second length, a second distance between the second top fold line and the second bottom fold line being substantially equal to the second tightener height; and
   wherein the top side of the middle covering is foldable along a top fold line extending a length of the middle rollable rectangular layer, the middle bottom side is foldable along a bottom fold line extending the second length, a distance between the top fold line and the bottom fold line being substantially equal to the first and second tightener height.

3. The attached rack covering structure of claim 2, wherein the first rollable rectangular layer further comprises a first top fastener and a first bottom fastener, the first top fastener positioned above the first top fold line, the first bottom fastener positioned above the first bottom fold line;

wherein the second rollable rectangular layer further comprises a second top fastener and a second bottom fastener, the second top fastener positioned above the second top fold line, the second bottom fastener positioned above the second bottom fold line; and wherein the middle rollable rectangular layer further comprises a top fastener and a bottom fastener, the top fastener positioned above the top fold line, the bottom fastener positioned above the bottom fold line.

4. The attached rack covering structure of claim 1, wherein:

the first tightener is configured to be coupled to a first vertical mounting post of the attached rack, the second tightener is configured to be coupled to a second vertical mounting post of the attached rack that is opposite the first vertical mounting post, the first rollable rectangular layer is configured to unfurl or unfold from first tightener, the second rollable rectangular layer is configured to unfold from the second tightener, the middle flexible rectangle sheet is configured to be unfurled or unfolded from either the first or second tightener, such that the first fastener and the middle left-sided fastener are fastened together and second fastener and the middle right-sided fastener are fastened together, each at about a ⅓ of the position between the first and second vertical mounting posts of the attached rack.

5. The attached rack covering structure of claim 4, wherein, when the first fastener, middle left-sided, middle right-sided, and second fastener are fastened together, the first side covering, middle covering, and second side covering combine to covering the opening in the attached rack.

6. The attached rack covering structure of claim 5, wherein the first tightener comprises:

a first reel, the second tightener comprises a second reel, and wherein:

in a furled state, the first rollable rectangular layer is configured to furl on the first cylinder of the first tightener, the second rollable rectangular layer is configured to furl on a second cylinder of the second tightener, the middle rollable rectangular layer is configured to furl on either the first or second cylinder of the first or second tightener, the first, middle, and second rollable rectangular layers do not cover the opening in the attached rack in the furled state.

7. A system for obstructing apertures in a attached rack comprising:

an upper covering structure for covering an upper opening in the attached rack and comprising a first upper side covering and a second upper side covering, the first upper side covering coupling to a first portion of the attached rack, the second upper side covering coupling to a second portion of the attached rack, the first upper side covering comprising a first upper side rollable rectangular layer configured to extend and retract from the first portion of the attached rack, the second upper side covering comprising a second upper side rollable rectangular layer configured to extend and retract from the second portion of the attached rack, the first upper side rollable rectangular layer and the second upper side rollable rectangular layer configured to couple to each other when in a first extended state so as to covering the upper opening, and a lower covering structure for covering a lower opening in the attached rack, the lower opening being immediately below the upper opening, the lower covering structure comprising a first lower side covering and a second lower side covering, the first lower side covering coupling to the first portion of the attached rack, the second lower side covering coupling to the second portion of the attached rack, the first lower side covering comprising a first lower side rollable rectangular layer configured to extend and retract from the first portion of the attached rack, the second lower side covering comprising a second lower side rollable rectangular layer configured to extend and retract from the second portion of the attached rack, the first lower side rollable rectangular layer and the second lower side rollable rectangular layer configured to couple to each other when in a second extended state so as to covering the lower opening.

8. The system of claim 7, wherein the first upper side covering further comprises a first upper tightener for exerting a retraction force on the first upper side rollable rectangular layer, the second upper side covering further comprises a second upper tightener for exerting a retraction force on the second upper side rollable rectangular layer, the first lower side covering further comprises a first lower tightener for exerting a retraction force on the first lower side rollable rectangular layer, and the second lower side covering further comprises a second lower tightener for exerting a retraction force on the second lower side rollable rectangular layer.

9. The system of claim 8, further comprising a first side shaft affixed relative to the first portion of the attached rack and a second side shaft affixed relative to the second portion of the attached rack, the first upper tightener and the first lower tightener being vertically arranged or stacked on the first side shaft, the second upper tightener and the second lower tightener being vertically arranged or stacked on the second side shaft.

10. A flexible attached rack covering structure for increasing heatflow and maintain enough flexibility to adapt other non-standard size equipment in the rack:

a first side covering comprising:

a first tightener and a first rollable rectangular layer (208) comprising a first lateral side, a first medial side opposite the first lateral side, a first top side, a first bottom side opposite the first top side and adjacent the first lateral side and the first medial side, the first medial side comprising a first fastener, the first tightener coupled to the first rollable rectangular layer at or near the first lateral side, the first tightener comprising a first tightener height that is less than a first sheet height between the first top side and the first bottom side, the first top side is foldable along a first top fold line extending a first length of the first reliable rectangular layer, the first bottom side is foldable along a first bottom fold line extending the first length, a first distance between the first top fold line and the first bottom fold line being substantially equal to the first tightener height, and a first op fastener and a first bottom fastener, the first top fastener positioned above the first top fold line, the first bottom fastener positioned above the first bottom fold line, a second side covering comprising a second tightener and a second rollable rectangular layer comprising:
  a second lateral side,
  a second medial side opposite the second lateral side,
  a second top side,
  a second bottom side opposite the second top side and adjacent the second lateral side and the second medial side,
    the second medial side comprising a second fastener configured to couple with the first fastener, the second tightener coupled to the second rollable rectangular layer at or near the second lateral side, the second tightener comprising a second tightener height that is less than a second sheet height between the second top side and the second bottom side, and
    the second top side is foldable along a second top fold line extending a second length of the second rollable rectangular layer, the second bottom side is foldable along a second bottom fold line extending the second length, a second distance between the second top fold line and the second bottom fold line being substantially equal to the second tightener height, and
  a second top fastener and a second bottom fastener, the second top fastener positioned above the second top fold line, the second bottom fastener positioned above the second bottom fold line;
a middle covering comprising a middle rectangular sheet comprising:
  a left side of the middle covering coupleable to the first medial side via a middle left-sided fastener;
  a right side of the middle covering coupleable to the second medial side via a middle right-sided fastener;
  a middle top side;
  a middle bottom side;
  a middle rollable rectangular layer coupled between the left side, right side, top side, and bottom side, wherein:
    the middle rollable rectangular layer, the first side covering and the second side covering are configured to be used in conjunction with one another to covering an opening in an attached rack, and
    the top side of the middle covering is foldable along a top fold line extending a length of the middle rollable rectangular layer, the middle bottom side is foldable along a bottom fold line extending the second length, a distance between the top fold line and the bottom fold line being substantially equal to the first and second tightener height; and
  a top fastener and a bottom fastener, the top fastener positioned above the top fold line, the bottom fastener positioned above the bottom fold line, wherein the top and bottom fasteners of the middle covering can move sideways such that the top and bottom fasteners of the middle covering can attach the top and bottom fasteners of either the first or second side covering, in doing so would allow a hole, which allows the installation of a non-standard size equipment.

\* \* \* \* \*